United States Patent
Zheng et al.

(10) Patent No.: US 11,385,305 B2
(45) Date of Patent: Jul. 12, 2022

(54) MAGNETIC SENSOR ARRAY WITH DUAL TMR FILM

(71) Applicant: Western Digital Technologies, Inc., San Jose, CA (US)

(72) Inventors: Yuankai Zheng, Fremont, CA (US);
Christian Kaiser, San Jose, CA (US);
Zhitao Diao, Fremont, CA (US);
Chih-Ching Hu, Pleasanton, CA (US);
Chen-Jung Chien, Mountain View, CA (US); Yung-Hung Wang, San Jose, CA (US); Dujiang Wan, San Ramon, CA (US); Ronghui Zhou, Fremont, CA (US); Ming Mao, Dublin, CA (US);
Ming Jiang, San Jose, CA (US);
Daniele Mauri, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 375 days.

(21) Appl. No.: 16/718,667

(22) Filed: Dec. 18, 2019

(65) Prior Publication Data

US 2021/0063504 A1    Mar. 4, 2021

Related U.S. Application Data

(60) Provisional application No. 62/892,391, filed on Aug. 27, 2019.

(51) Int. Cl.
*G01R 33/09* (2006.01)
*H01L 43/08* (2006.01)
(Continued)

(52) U.S. Cl.
CPC ....... *G01R 33/098* (2013.01); *H01F 10/3254* (2013.01); *H01F 10/3272* (2013.01);
(Continued)

(58) Field of Classification Search
CPC .............. G01R 33/098; G01R 33/0052; G01R 33/0005; G01R 33/093; H01F 10/3254;
(Continued)

(56) References Cited

U.S. PATENT DOCUMENTS

| 7,054,114 B2 * | 5/2006 | Jander | H01F 41/302 360/324.1 |
| 7,286,329 B1 * | 10/2007 | Chen | G01R 31/318357 360/324.12 |

(Continued)

FOREIGN PATENT DOCUMENTS

CN          101813479 A        8/2010

OTHER PUBLICATIONS

"TMR Gear tooth sensor with high sensitivity to magnetic field," TMR400X Datasheet V1.0a, American Electronic Components Incorporated, 6 pages, <https://www.aecsensors.com/components/com_virtuemart/shop_image/product/Magnetic-Tunnelling-Magnetoresistive-(TMR)-Gear-Speed-Sensors/pdfs/TMR400X-Datasheet.pdf>.

(Continued)

*Primary Examiner* — Alvaro E Fortich
*Assistant Examiner* — Zannatul Ferdous
(74) *Attorney, Agent, or Firm* — Patterson + Sheridan, LLP; Steven H. Versteeg

(57) ABSTRACT

A tunneling magnetoresistance (TMR) sensor device is disclosed that includes one or more TMR sensors. The TMR sensor device comprises a first resistor comprising a first TMR film, a second resistor comprising a second TMR film different than the first TMR film, a third resistor comprising the second TMR film, and a fourth resistor comprising the first TMR film. The first TMR film comprises a reference layer having a first magnetization direction anti-parallel to a second magnetization direction of a pinned layer. The sec- (Continued)

ond TMR film comprises a reference layer having a first magnetization direction parallel to a second magnetization direction of a first pinned layer, and a second pinned layer having a third magnetization direction anti-parallel to the first magnetization direction of the reference layer and the second magnetization direction of the first pinned layer.

20 Claims, 5 Drawing Sheets

(51) Int. Cl.
| | |
|---|---|
| H01L 27/22 | (2006.01) |
| H01L 43/10 | (2006.01) |
| H01L 43/12 | (2006.01) |
| H01F 10/32 | (2006.01) |
| H01F 41/30 | (2006.01) |

(52) U.S. Cl.
CPC ........... *H01F 41/302* (2013.01); *H01L 27/22* (2013.01); *H01L 43/08* (2013.01); *H01L 43/10* (2013.01); *H01L 43/12* (2013.01)

(58) Field of Classification Search
CPC ... H01F 10/3272; H01F 41/302; H01L 27/22; H01L 43/08; H01L 43/10; H01L 43/12
See application file for complete search history.

(56) References Cited

U.S. PATENT DOCUMENTS

| | | | |
|---|---|---|---|
| 9,069,033 B2 | 6/2015 | Chen et al. | |
| 9,177,575 B1 | 11/2015 | Gao et al. | |
| 9,591,221 B2 | 3/2017 | Miller et al. | |
| 9,684,184 B2 | 6/2017 | Miller et al. | |
| 10,277,992 B2 | 4/2019 | Deak et al. | |
| 10,868,235 B2* | 12/2020 | Beach | H01L 27/224 |
| 10,916,696 B2* | 2/2021 | Pinarbasi | H01L 43/12 |
| 2006/0267056 A1 | 11/2006 | Ju et al. | |
| 2011/0025320 A1 | 2/2011 | Ohta et al. | |
| 2011/0169112 A1* | 7/2011 | Chen | H01L 43/08 |
| | | | 257/E29.323 |
| 2012/0049843 A1* | 3/2012 | Sun | H01L 43/12 |
| | | | 324/252 |
| 2012/0068698 A1 | 3/2012 | Chen et al. | |
| 2016/0238635 A1 | 8/2016 | Zimmer | |
| 2017/0373246 A1 | 12/2017 | Wang et al. | |
| 2018/0372685 A1 | 12/2018 | Chen et al. | |
| 2019/0020822 A1 | 1/2019 | Sharma et al. | |
| 2019/0109278 A1 | 4/2019 | Kardasz et al. | |

OTHER PUBLICATIONS

Clark et al. "Magnetostrictive Properties of Body-Centered Cubic Fe—Ga and Fe—Ga—Al Alloys," IEEE Transactions on Magnetics, vol. 36, No. 5, Sep. 2000, pp. 3238-3240.

Freitas et al. "Spintronic Sensors," Proceedings of the IEEE, Oct. 2016, vol. 104, No. 10, pp. 1894-1918.

Lu et al. "Doubly exchange-biased FeMn/NiFe/Cu/NiFe/CrMnPt spin valves," IEEE Transactions on Magnetics, Sep. 2000, vol. 36, No. 5, pp. 2899-2901, doi: 10.1109/20.908621.

International Search Report and the Written Opinion for International Application No. PCT/US2020/024078 dated Jul. 14, 2020, 10 pages.

International Preliminary Report on Patentability for International Application No. PCT/US2020/024078 dated Mar. 10, 2022, 7 pages.

* cited by examiner

MAGNETIC SENSOR ARRAY WITH DUAL TMR FILM

CROSS-REFERENCE TO RELATED APPLICATIONS

This application claims benefit of U.S. provisional patent application Ser. No. 62/892,391, filed Aug. 27, 2019, which is herein incorporated by reference.

BACKGROUND OF THE DISCLOSURE

Field of the Disclosure

Embodiments of the present disclosure generally relate to a tunneling magnetoresistance sensor device, such as a Wheatstone bridge array, and a method of fabrication thereof.

Description of the Related Art

A Wheatstone bridge is an electrical circuit used to measure an unknown electrical resistance by balancing two legs of a bridge circuit, one leg of which includes an unknown component. The Wheatstone circuit provides extremely accurate measurements in comparison to a simple voltage divider.

The Wheatstone bridge includes multiple resistors that, especially recently, include magnetic material such as magnetic sensors. Magnetic sensors can include Hall effect magnetic sensors, anisotropy magnetoresistive sensors (AMR), giant magnetoresistive (GMR) sensors, and tunneling magnetoresistive (TMR) sensors. The TMR sensor has a very high sensitivity compared to other magnetic sensors.

Typical Wheatstone bridges comprise four resistors, where a first and a fourth resistor both comprise a free layer having a magnetization direction disposed at a +45° to a magnetization direction of a pinned layer, and a second and third resistor both comprises a free layer having a magnetization direction disposed at a −45° to a magnetization direction of a pinned layer. All four of the resistors are comprised of the same material or film, and as such, the pinned layer of each of the four resistors has the same magnetization direction.

When applying a magnetic field to the Wheatstone bridge, the first and fourth resistors increase with the applied magnetic field while the second and third resistors decrease with the applied magnetic field. However, only half of the magnetoresistance change can be utilized in such a design due to the ±45° between the magnetization directions of the free layer and the pinned layer. Other Wheatstone bridge designs result in reduced output voltage or limited sensitivity.

Therefore, there is a need in the art for a magnetic sensor, and method of fabricating thereof, that operates in the full magnetoresistance range while achieving the maximum output voltage or sensitivity.

SUMMARY OF THE DISCLOSURE

A TMR sensor device is disclosed that includes one or more TMR sensors. The Wheatstone bridge array comprises a first resistor comprising a first TMR film, a second resistor comprising a second TMR film different than the first TMR film, a third resistor comprising the second TMR film, and a fourth resistor comprising the first TMR film. The first TMR film comprises a reference layer having a first magnetization direction anti-parallel to a second magnetization direction of a pinned layer. The second TMR film comprises a reference layer having a first magnetization direction parallel to a second magnetization direction of a first pinned layer, and a second pinned layer having a third magnetization direction anti-parallel to the first magnetization direction of the reference layer and the second magnetization direction of the first pinned layer.

In one embodiment, a TMR sensor device comprises at least one TMR sensor comprising a first TME film, the first TMR film comprising a first reference layer having a first magnetization direction and a first pinned layer having a second magnetization direction, the first magnetization direction of the first reference layer being anti-parallel to the second magnetization direction of the first pinned layer, wherein the first pinned layer comprises a Cobalt (Co)/Cobalt-iron (CoFe)/Co multi-layer stack having a thickness between about 20 Angstroms and about 30 Angstroms, and wherein the first reference layer comprises a CoFe/Tantalum (Ta)/Cobalt-iron0-boron (CoFeB)/CoFe multilayer stack having a thickness between about 21 Angstroms and about 37 Angstroms, and at least one TMR sensor comprising a second TMR film, the second TMR film comprising a second reference layer having a first third magnetization direction, a first second pinned layer having the first third magnetization direction, and a second third pinned layer having a second fourth magnetization direction, the first third magnetization direction of the second reference layer and the first second pinned layer being anti-parallel to the second fourth magnetization direction of the second third pinned layer, wherein the second pinned layer comprises a Co/CoFe/Co multi-layer stack having a thickness between about 20 Angstroms and about 30 Angstroms, wherein the third pinned layer comprises a Co/CoFe/Co multi-layer stack having a thickness between about 35 Angstroms and about 55 Angstroms, and wherein the second reference layer comprises a CoFe/Ta/CoFeB/CoFe multilayer stack having a thickness between about 21 Angstroms and about 37 Angstroms.

In another embodiment, a TMR sensor device comprises a first resistor comprising a first TMR film, the first TMR film comprising a first reference layer having a first magnetization direction, wherein the first reference layer comprises a CoFe/Ta/CoFeB/CoFe multilayer stack having a thickness between about 21 Angstroms and about 37 Angstroms, a second resistor comprising a second TMR film, the second TMR film comprising a second reference layer having a second magnetization direction, wherein the second reference layer comprises a CoFe/Ta/CoFeB/CoFe multilayer stack having a thickness between about 21 Angstroms and about 37 Angstroms, and wherein the first magnetization direction of the first reference layer of the first TMR film is anti-parallel to the second magnetization of the second reference layer of the second TMR film, a third resistor comprising the second TMR film, and a fourth resistor comprising the first TMR film.

In another embodiment, a method of fabricating a TMR sensor device having a first resistor, a second resistor, a third resistor, and a fourth resistor, comprising forming a first TMR film by depositing a first seed layer, depositing a first antiferromagnetic layer on the first seed layer, depositing a first pinned layer on the first antiferromagnetic layer, the first pinned layer comprising a Co/CoFe/Co multi-layer stack having a thickness between about 20 Angstroms and about 30 Angstroms, depositing a first spacer layer on the first pinned layer, depositing a first reference layer on the first spacer layer, the first reference layer comprising a CoFe/Ta/

CoFeB/CoFe multilayer stack having a thickness between about 21 Angstroms and about 37 Angstroms, depositing a first barrier layer on the first reference layer, and depositing a first free layer on the first barrier layer, magnetically annealing the first TMR film to change a first magnetization direction of the first reference layer to be anti-parallel to a second magnetization direction of the first pinned layer, forming a second TMR film by depositing a second seed layer, depositing a second antiferromagnetic layer on the second seed layer, depositing a second pinned layer on the second antiferromagnetic layer, the second pinned layer comprising a Co/CoFe/Co multi-layer stack having a thickness between about 20 Angstroms and about 30 Angstroms, depositing a second spacer layer on the second pinned layer, depositing a third pinned layer on the second spacer layer, the third pinned layer comprising a Co/CoFe/Co multi-layer stack having a thickness between about 35 Angstroms and about 55 Angstroms, depositing a third spacer layer on the third pinned layer, depositing a second reference layer on the third spacer layer, the second reference layer comprising a CoFe/Ta/CoFeB/CoFe multilayer stack having a thickness between about 21 Angstroms and about 37 Angstroms, depositing a second barrier layer on the second reference layer, and depositing a second free layer on the second barrier layer, magnetically annealing the second TMR film to change a third magnetization direction of the third pinned layer to be anti-parallel to a fourth magnetization direction of the second reference layer, wherein the first magnetization direction of the first reference layer of the first TMR film is anti-parallel to the fourth magnetization direction of the second reference layer of the second TMR film, forming the first resistor and the fourth resistor from the first TMR film, and forming the second resistor and the third resistor from the second TMR film, wherein the first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

A tunneling magnetoresistance (TMR) sensor device is disclosed that includes one or more TMR sensors. The Wheatstone bridge array comprises a first resistor comprising a first TMR film, a second resistor comprising a second TMR film different than the first TMR film, a third resistor comprising the second TMR film, and a fourth resistor comprising the first TMR film. The first TMR film comprises a reference layer having a first magnetization direction anti-parallel to a second magnetization direction of a pinned layer. The second TMR film comprises a reference layer having a first magnetization direction parallel to a second magnetization direction of a first pinned layer, and a second pinned layer having a third magnetization direction anti-parallel to the first magnetization direction of the reference layer and the second magnetization direction of the first pinned layer.

Figure 1:
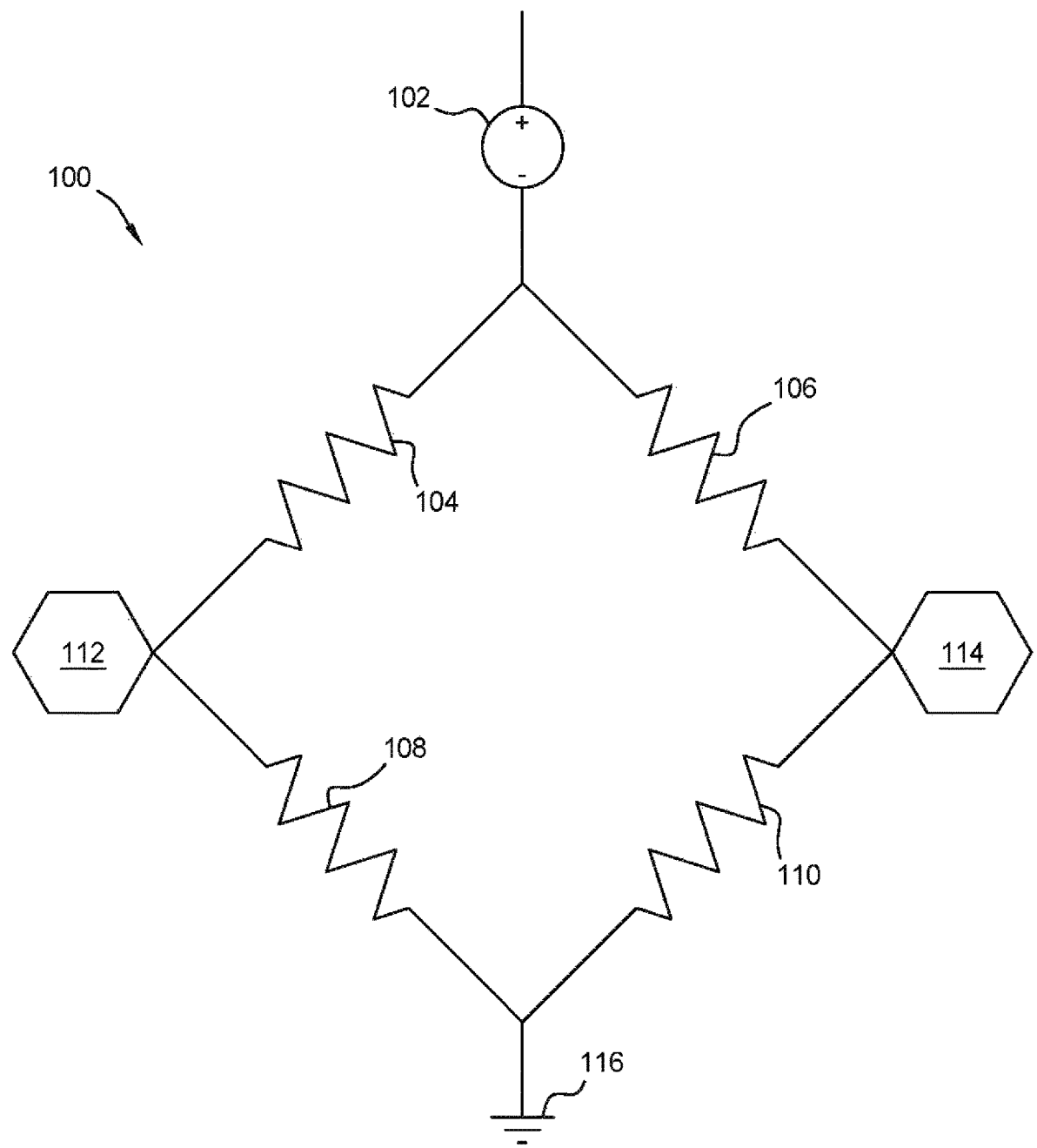
FIG. 1 is a schematic illustration of a TMR sensor device design.

FIG. 1 is a schematic illustration of a TMR sensor device 100 design, such as a Wheatstone bridge array. The TMR sensor device 100 includes a bias source 102, a first resistor 104, a second resistor 106, a third resistor 108, a fourth resistor 110, a first sensor 112, a second sensor 114, and a ground connection 116. Bias voltage is applied across the array from the bias source 102 to the ground connection 116. The first sensor 112 and the second sensor 114 sense the output of the applied voltage. Any temperature change from the resistors 104, 106, 108, 110 can be cancelled.

As discussed herein, the resistors 104, 106, 108, 110 each include a TMR sensor. In one embodiment, the TMR sensors are each distinct and different such that the resistors 104, 106, 108, 110 have different resistance. In another embodiment, the TMR sensors are identical, but the resistors 104, 106, 108, 110 are different. In still another embodiment, resistors 104, 110 are identical to each other (as are the TMR sensors that comprise the resistors 104, 110), and resistors 106, 108 are identical to each other (as are the TMR sensors that comprise the resistors 106, 108) yet different than resistors 104, 110. For a TMR sensor in the TMR sensor device 100, the RA for the array 100 is around 100 Ohms microns$^2$.

Figure 2:
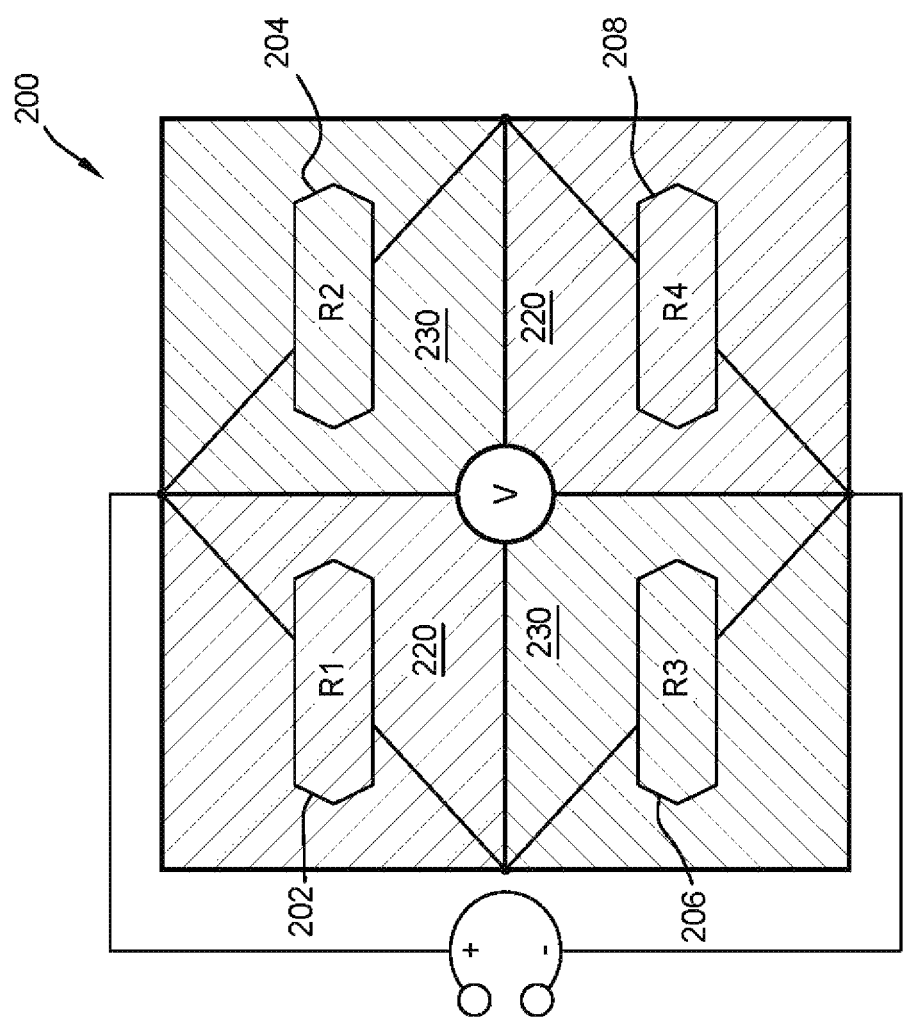
FIG. 2 is a schematic view illustrating a first TMR film and a second TMR film used to form resistors of a TMR sensor device, according to one embodiment.

FIG. 2 is a schematic view illustrating a first TMR film 220 and a second TMR film 230 used to form the resistors 202, 204, 206, 208 of a TMR based magnetic sensor or TMR sensor device 200, such as a Wheatstone bridge array, according to one embodiment. The TMR sensor device 200 may be the TMR sensor device 100 of FIG. 1. Each of the resistors 202, 204, 206, 208 functions as a TMR sensor.

As shown in FIG. 2, a first resistor R1 202 and a fourth resistor R4 208 both comprise the first TMR film 220 while a second resistor R2 204 and a third resistor R3 206 both comprise the second TMR film 230. The TMR resistance of the first and fourth resistors R1/R4 202, 208 formed of the first TMR film 220 increase linearly with an external magnetic field while the TMR resistance of the second and third resistors R2/R3 204, 206 formed of the second TMR film 230 decrease linearly with an external magnetic field. Alternatively, the TMR resistance of the first and fourth resistors R1/R4 202, 208 formed of the first TMR film 220 may decrease linearly with an external magnetic field while the TMR resistance of the second and third resistors R2/R3 204, 206 formed of the second TMR film 230 may increase linearly with an external magnetic field. As such, the two different TMR films 220, 230 provide two different magnetoresistance responses.

Figure 3A:
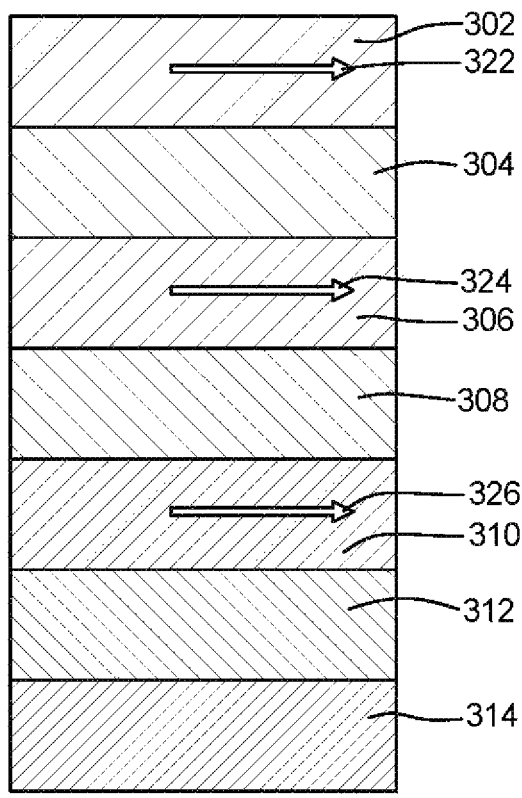
FIGS. 3A-3B illustrate a first TMR film, or TMR film A, in various stages of formation, according to one embodiment.
Figure 3B:
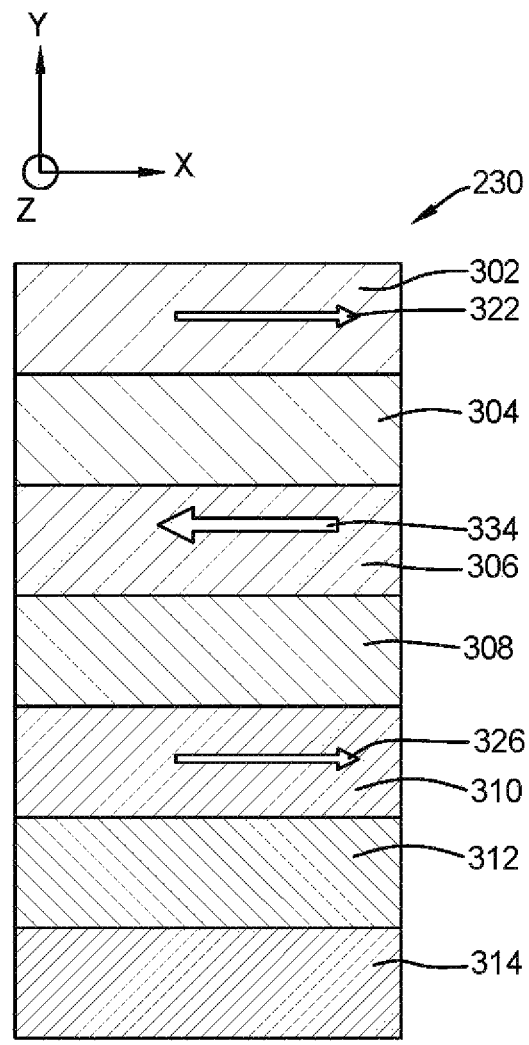

FIGS. 3A-3B illustrate the first TMR film 220 of FIG. 2, or TMR film A, in various stages of formation, according to one embodiment. FIG. 3A illustrates the first TMR film 220 during a magnetic anneal and FIG. 3B illustrates the first TMR film 220 post magnetic anneal. The first TMR film 220 may function as one or more TMR sensors. FIG. 3B illustrates the first TMR film 220 used in the TMR sensor device 200 of FIG. 2.

The first TMR film 220 comprises a free layer (FL) 302, a barrier layer 304 disposed below and in contact with the FL 302, a reference layer (RL) 306 disposed below and in contact with the barrier layer 304, a spacer layer 308 disposed below and in contact with the RL 306, a pinned layer (PL) 310 disposed below and in contact with the spacer layer 308, an antiferromagnetic (AFM) layer 312 disposed below and in contact with the PL 310, and a seed layer 314 disposed below and in contact with the AFM layer 312. The FL 302 may be referred to as a sense layer. The first TMR film 220 has a total thickness between about 120 Angstroms to about 630 Angstroms.

In one embodiment, the seed layer 314 comprises a conductive material, such as ruthenium, having a thickness between about 10 Angstroms to about 100 Angstroms, and is deposited by well-known deposition methods such as electroplating, electroless plating, or sputtering. Additionally, it is to be understood that while ruthenium has been exemplified as the seed layer 314 material, other materials are contemplated and the embodiments discussed herein are not limited to ruthenium for the seed layer 314.

Suitable materials for the AFM layer 312 include IrMn or PtMn at a thickness between about 40 Angstroms to about 100 Angstroms. The AFM layer 312 may be formed by well-known deposition methods such as sputtering. Additionally, it is to be understood that while IrMn and PtMn have been exemplified as the AFM layer 312 materials, other materials are contemplated and the embodiments discussed herein are not limited to IrMn or PtMn for the AFM layer 312.

Suitable materials for the pinned layer 310 include CoFe or a Co/CoFe/Co multi-layer stack with a thickness between about 20 Angstroms and about 30 Angstroms. In one embodiment, the Co composition in CoFe is between about 25% and 70%. The pinned layer 310 may be formed by well-known deposition methods such as sputtering. Additionally, it is to be understood that while CoFe or Co/CoFe/Co have been exemplified as the pinned layer 310 material, other materials are contemplated and the embodiments discussed herein are not limited to CoFe or Co/CoFe/Co for the pinned layer 310.

Suitable materials for the spacer layer 308 include Ru at a thickness between about 4 Angstroms to about 10 Angstroms. The spacer layer 308 may be formed by well-known deposition methods such as sputtering. Additionally, it is to be understood that while ruthenium has been exemplified as the spacer layer 308 material, other materials are contemplated and the embodiments discussed herein are not limited to ruthenium for the spacer layer 308.

Suitable materials for the reference layer 306 include CoFe/Ta/CoFeB/CoFe as a multilayer stack having a thickness between about 21 Angstroms and about 37 Angstroms. The first CoFe layer may have a thickness between about 8 Angstroms to about 10 Angstroms. In one embodiment, the Co composition in the first CoFe layer is between about 0% and 25%. The Ta layer may have a thickness between about 0.5 Angstroms to about 2 Angstroms. The CoFeB layer may have a thickness between about 10 Angstroms to about 15 Angstroms. In one embodiment, the B composition in the CoFeB layer is between about 15% and 25%. The second CoFe layer may have a thickness between about 3 Angstroms to about 10 Angstroms. In one embodiment, the Co composition in the second CoFe layer is between about 10% and 70%. The reference layer 306 may be formed by well-known deposition methods such as sputtering.

Additionally, it is to be understood that while CoFe/Ta/CoFeB/CoFe has been exemplified as the reference layer 306 material, other materials are contemplated and the embodiments discussed herein are not limited to CoFe/Ta/CoFeB/CoFe for the reference layer 306.

Suitable material for the barrier layer 304 includes MgO at a thickness between about 10 Angstroms to about 20 Angstroms. It is to be understood that while MgO is exemplified as the barrier layer 304, other insulating materials as contemplated.

Suitable materials for the free layer 302 include a CoFe/CoFeB/Ta/NiFe multilayer stack having a thickness between about 16 Angstroms to about 332 Angstroms. The CoFe layer may have a thickness between about 3 Angstroms to about 10 Angstroms. The CoFeB layer may have a thickness between about 10 Angstroms to about 20 Angstroms. The Ta layer may have a thickness between about 0.5 Angstroms to about 2 Angstroms. The NiFe layer may have a thickness between about 3 Angstroms to about 300 Angstroms, such as between about 3 Angstroms and about 10 Angstroms or between about 10 Angstroms and about 300 Angstroms. The free layer 302 may be formed by well-known deposition methods such as sputtering. Additionally, it is to be understood that while CoFe/CoFeB/Ta/NiFe has been exemplified as the free layer 302 material, other materials are contemplated and the embodiments discussed herein are not limited to CoFe/CoFeB/Ta/NiFe for the free layer 302.

FIG. 3A illustrates the first TMR film 220 during a magnetic anneal. After the layers of the first TMR film 220 have been deposited, the first TMR film 220 is annealed in a magnetic oven at a temperature of between about 250 degrees Celsius and about 300 degrees Celsius under a magnetic field of between about 1 Tesla to about 5 Tesla. During the magnetic anneal, the FL 302 has a magnetization direction 322 pointing in the x-direction, the RL 306 has a first magnetization direction 324 pointing in the x-direction, and the PL 310 has a first magnetization direction 326 pointing in the x-direction. Thus, during the magnetic anneal, the magnetization direction 326 of the PL 310 is parallel to the magnetization direction 322 of the FL 302 and to the magnetization direction 324 of the RL 306.

In FIG. 3B, after the magnetic anneal, the FL 302 has the magnetization direction 322 pointing in the x-direction, the RL 306 has a second magnetization direction 334 pointing in the −x-direction, and the PL 310 has the first magnetization direction 326 pointing in the x-direction. Thus, during the magnetic anneal, the magnetization direction 326 of the PL 310 is parallel to the magnetization direction 322 of the FL 302 and anti-parallel to the magnetization direction 334 of the RL 306.

The magnetization direction 326 of the PL 310 is pinned by the AFM layer 312, and as such, the magnetic moment of the PL 310 does not change when an external field is applied. The RL 306 is antiferromagnetically coupled with the PL 310 through the spacer layer 308. Thus, post magnetic anneal, the magnetization direction of the RL 306 is fixed when an external field is applied. The FL 302 may be biased when an external field is applied to obtain a linear signal, and the magnetic moment of the FL 302 may further rotate when an external field is applied.

Figure 4A:
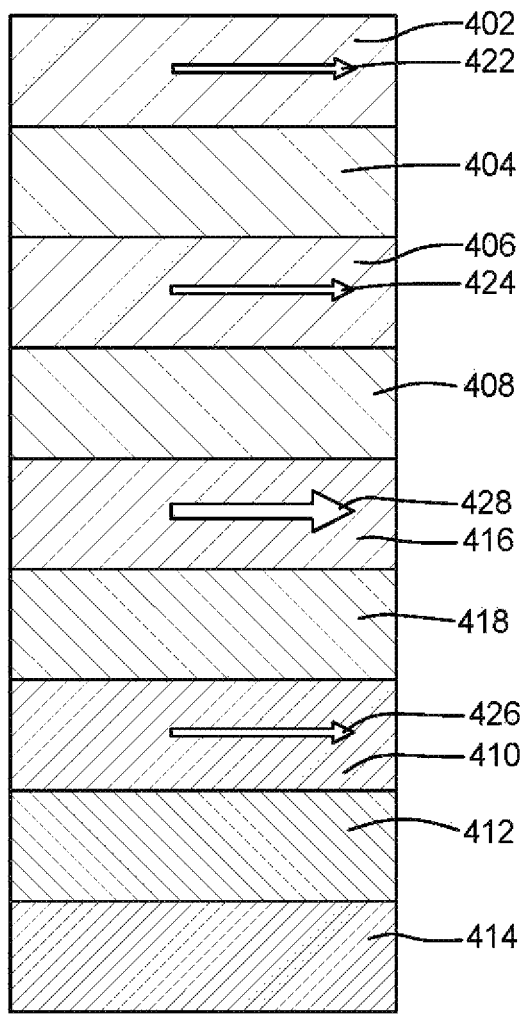
FIGS. 4A-4B illustrate a second TMR film, or TMR film B, in various stages of formation, according to another embodiment.
Figure 4B:
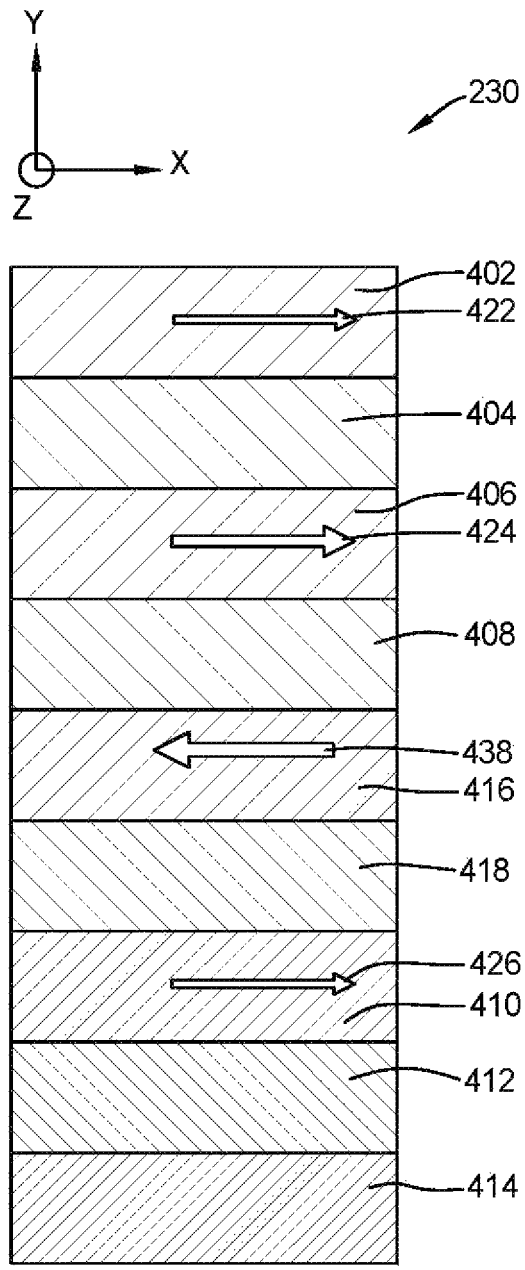

FIGS. 4A-4B illustrate the second TMR film 230 of FIG. 2, or TMR film B, in various stages of formation, according to one embodiment. FIG. 4A illustrates the second TMR film 230 during a magnetic anneal and FIG. 4B illustrates the second TMR film 230 post magnetic anneal. The second TMR film 230 may function as one or more TMR sensors. FIG. 4B illustrates the second TMR film 230 used in the TMR sensor device 200 of FIG. 2.

The second TMR film 230 comprises a FL 402, a barrier layer 404 disposed below and in contact with the FL 402, a RL 406 disposed below and in contact with the barrier layer 404, a first spacer layer 408 disposed below and in contact with the RL 406, a second pinned layer (PL2) 416 disposed below and in contact with the first spacer layer 408, a second spacer layer 418 disposed below and in contact with the PL2 416, a first pinned layer (PL1) 410 disposed below and in contact with the second spacer layer 418, an AFM layer 412 disposed below and in contact with the PL1 410, and a seed layer 414 disposed below and in contact with the AFM layer 412. The FL 402 may be referred to as a sense layer. The second TMR film 230 has a total thickness between about 155 Angstroms to about 1,675 Angstroms.

In one embodiment, the seed layer 414 comprises a conductive material, such as ruthenium, having a thickness between about 10 Angstroms to about 100 Angstroms, and is deposited by well-known deposition methods such as electroplating, electroless plating, or sputtering. Additionally, it is to be understood that while ruthenium has been exemplified as the seed layer 414 material, other materials are contemplated and the embodiments discussed herein are not limited to ruthenium for the seed layer 414.

Suitable materials for the AFM layer 412 include IrMn or PtMn at a thickness between about 40 Angstroms to about 100 Angstroms. The AFM layer 412 may be formed by well-known deposition methods such as sputtering. Additionally, it is to be understood that while IrMn and PtMn have been exemplified as the AFM layer 412 materials, other materials are contemplated and the embodiments discussed herein are not limited to IrMn or PtMn for the AFM layer 412.

Suitable materials for the first pinned layer 410 include CoFe or a Co/CoFe/Co multi-layer stack with a thickness between about 20 Angstroms and about 30 Angstroms. In one embodiment, the Co composition in CoFe is between about 25% and 70%. The first pinned layer 410 may be formed by well-known deposition methods such as sputtering. Additionally, it is to be understood that while CoFe or Co/CoFe/Co have been exemplified as the material of the first pinned layer 410, other materials are contemplated and the embodiments discussed herein are not limited to CoFe or Co/CoFe/Co for the first pinned layer 410.

Suitable materials for the second pinned layer 416 include CoFe or a Co/CoFe/Co multi-layer stack with a thickness between about 35 Angstroms and about 55 Angstroms. Thus, the second pinned layer 416 has a greater thickness in the y-direction than the first pinned layer 410. In one embodiment, the second pinned layer 416 has a thickness in the y-direction 1 to 2 times greater than the first pinned layer 410. The first Co layer may have a thickness of about 5 Angstroms, the CoFe layer may have a thickness of about 30 Angstroms, and the second Co layer may have a thickness of about 5 Angstroms. In one embodiment, the Co composition in the CoFe layer is between about 25% and 70%. The second pinned layer 416 may be formed by well-known deposition methods such as sputtering. Additionally, it is to be understood that while CoFe or Co/CoFe/Co have been exemplified as the material of the second pinned layer 416, other materials are contemplated and the embodiments discussed herein are not limited to CoFe or Co/CoFe/Co for the second pinned layer 416.

Suitable materials for each of the first and second spacer layers 408, 418 include Ru at a thickness between about 4 Angstroms to about 10 Angstroms. The first and second spacer layers 408, 418 may be formed by well-known deposition methods such as sputtering. Additionally, it is to be understood that while ruthenium has been exemplified as the material of the first and second spacer layers 408, 418, other materials are contemplated and the embodiments discussed herein are not limited to ruthenium for the first and second spacer layers 408, 418.

Suitable materials for the reference layer 406 include CoFe/Ta/CoFeB/CoFe as a multilayer stack having a thickness between about 21 Angstroms and about 37 Angstroms. The first CoFe layer may have a thickness between about 8 Angstroms to about 10 Angstroms. In one embodiment, the Co composition in the first CoFe layer is between about 0% and 25%. The Ta layer may have a thickness between about 0.5 Angstroms to about 2 Angstroms. The CoFeB layer may have a thickness between about 10 Angstroms to about 15 Angstroms. In one embodiment, the B composition in CoFeB is between about 15% and 25%. The second CoFe layer may have a thickness between about 3 Angstroms to about 10 Angstroms. In one embodiment, the Co composition in the second CoFe layer is between about 10% and 70%. The reference layer 406 may be formed by well-known deposition methods such as sputtering. Additionally, it is to be understood that while CoFe/Ta/CoFeB/CoFe has been exemplified as the reference layer 406 material, other materials are contemplated and the embodiments discussed herein are not limited to CoFe/Ta/CoFeB/CoFe for the reference layer 406.

Suitable material for the barrier layer 404 includes MgO at a thickness between about 10 Angstroms to about 20 Angstroms. It is to be understood that while MgO is exemplified as the barrier layer 404, other insulating materials as contemplated.

Suitable materials for the free layer 402 include a CoFe/CoFeB/Ta/NiFe multilayer stack having a thickness between about 16 Angstroms to about 332 Angstroms. The CoFe layer may have a thickness between about 3 Angstroms to about 10 Angstroms. The CoFeB layer may have a thickness between about 10 Angstroms to about 20 Angstroms. The Ta layer may have a thickness between about 0.5 Angstroms to about 2 Angstroms. The NiFe layer may have a thickness between about 3 Angstroms to about 300 Angstroms, such as between about 3 Angstroms and about 10 Angstroms or between about 10 Angstroms and about 300 Angstroms. The free layer 402 may be formed by well-known deposition methods such as sputtering. Additionally, it is to be understood that while CoFe/CoFeB/Ta/NiFe has been exemplified as the free layer 402 material, other materials are contemplated and the embodiments discussed herein are not limited to CoFe/CoFeB/Ta/NiFe for the free layer 402.

FIG. 4A illustrates the second TMR film 230 during a magnetic anneal. After the layers of the second TMR film 230 have been deposited, the second TMR film 230 is annealed in a magnetic oven at a temperature between about 250 degrees Celsius and about 300 degrees Celsius under a magnetic field of between about 1 Tesla to about 5 Tesla. During the magnetic anneal, the FL 402 has a magnetization direction 422 pointing in the x-direction, the RL 406 has a first magnetization direction 424 pointing in the x-direction, the PL1 410 has a first magnetization direction 426 pointing in the x-direction, and the PL2 416 has a first magnetization direction 428 pointing in the x-direction. Thus, during the magnetic anneal, the magnetization direction 426 of the PL1 410 is parallel to the magnetization direction 422 of the FL 402, to the magnetization direction 424 of the RL 406, and to the magnetization direction 428 of the PL2 416.

In FIG. 4B, after the magnetic anneal, the FL 402 has a magnetization direction 422 pointing in the x-direction, the RL 406 has a first magnetization direction 424 pointing in the x-direction, the PL1 410 has a first magnetization direction 426 pointing in the x-direction, and the PL2 416 has a second magnetization direction 438 pointing in the −x-direction. Thus, after the magnetic anneal, the magnetization direction 426 of the PL1 410 is parallel to the magnetization direction 422 of the FL 402 and to the magnetization direction 424 of the RL 406. However, the magnetization direction 426 of the PL1 410 is anti-parallel to the magnetization direction 438 of the PL2 418.

The magnetization direction 426 of the PL1 410 is pinned by the AFM layer 412, and as such, the magnetic moment of the PL1 410 does not change when an external field is applied in the working field range, such as less than 600 Oe. The RL 406 is antiferromagnetically coupled with the PL 410 through the first spacer layer 408. Thus, post magnetic anneal, the magnetization direction of the RL 406 is fixed when an external field is applied in the working field range, such as less than 600 Oe. The FL 402 may be biased when an external field is applied to obtain a linear signal, and the magnetic moment of the FL 402 may further rotate when an external field is applied.

Comparing the first TMR film 220 to the second TMR film 230 used to form the TMR sensor device 200 of FIG. 2, the magnetization direction 322 of the FL 302 of the first TMR film 220 points in the x-direction and is parallel to the magnetization direction 422 of the FL 402 of the second film, which also points in the x-direction. The magnetization direction 334 of the RL 306 of the first TMR film 220 points in −x-direction and is anti-parallel to the magnetization direction 424 of the RL 406 of the second TMR film 230, which points in the x-direction. The magnetization direction 326 of the PL 310 of the first TMR film 220 points in the x-direction and is parallel to the magnetization direction 426 of the PL1 410 of the second TMR film 230, which also points in the x-direction. The magnetization direction 438 of the PL2 418 of the second film points in the −x-direction, is parallel to the magnetization direction 334 of the RL 306 of the first TMR film 220, and is anti-parallel to the magnetization direction 424 of the RL 406 of the second TMR film 230.

Because the first TMR film 220 and the second TMR film 230 have different RL magnetization directions, the TMR resistance response of each film is equal but opposite (i.e., one film increases linearly while the other film decreases linearly). As such, all the resistors 202, 204, 206, 208 in the TMR sensor device 200 of FIG. 2 can be operating in the full magnetoresistance range while achieving maximum output voltage or sensitivity for a given TMR ratio.

To form the TMR sensor device 200 of FIG. 2, each of the layers of the first TMR film 220 and each of the layers of the second TMR film 230 may be individually deposited. The layers of the first and second TMR films 220, 230 may be deposited simultaneously or the layers of one TMR film may be deposited before depositing the layers of the other TMR film (e.g., deposit each layer of the second TMR film 230 and then deposit each layer of the first TMR film 220). To form the first TMR film 220, the seed layer 314 is deposited, the AFM layer 312 is deposited on the seed layer 314, the pinned layer 310 is deposited on the AFM layer 312, the spacer layer 308 is deposited on the pinned layer 310, the reference layer 306 is deposited on the spacer layer 308, the barrier layer 304 is deposited on the reference layer 306, and the free layer 302 is deposited on the barrier layer 304.

The reference layer 306 may be plasma treated prior to depositing the barrier layer 304 to smooth the surface of the reference layer 306, or reduce a surface roughness of the reference layer 306, and to enhance the quality of the first TMR film 220. The reference layer 306 comprises CoFe/Ta/CoFeB/plasma treatment/CoFe as a multilayer stack. The plasma treatment is performed with low power, such as about 35 W, to slightly etch the amorphous CoFeB layer and to make the CoFeB layer smoother.

To form the second TMR film 230, the seed layer 414 is deposited, the AFM layer 412 is deposited on the seed layer 414, the first pinned layer 410 is deposited on the AFM layer 412, the second spacer layer 418 is deposited on the first pinned layer 410, the second pinned layer 416 is deposited on the second spacer layer 418, the first spacer layer 408 is deposited on the second pinned layer 416, the reference layer 406 is deposited on the first spacer layer 408, the barrier layer 404 is deposited on the reference layer 406, and the free layer 402 is deposited on the barrier layer 404.

The reference layer 406 may be plasma treated prior to depositing the barrier layer 404 to smooth the surface of the reference layer 406, or reduce a surface roughness of the reference layer 406, and to enhance the quality of the second TMR film 230. The reference layer 406 comprises CoFe/Ta/CoFeB/plasma treatment/CoFe as a multilayer stack. The plasma treatment is performed with low power, such as about 35 W, to slightly etch the amorphous CoFeB layer and to make the CoFeB layer smoother.

The first and second TMR films 220, 230 may then be heated in the magnetic oven, simultaneously or individually, at a temperature of between about 250 degrees Celsius and about 300 degrees Celsius under a magnetic field of between about 1 Tesla to about 5 Tesla. The first and second TMR films 220, 230 may then deposited over one or more bottom leads. For example, the first TMR film 220 may be deposited over a first bottom lead and a second bottom lead, and the second TMR film 230 may be deposited over a third bottom lead and a fourth bottom lead. One or more top leads may then be formed over the first and second TMR films 220, 230. For example, a first top lead may be formed over the first bottom lead, a second top lead may be formed over the second bottom lead, a third top lead may be formed over the third bottom lead, and a fourth top lead may be formed over the fourth bottom lead.

Figure 5A:
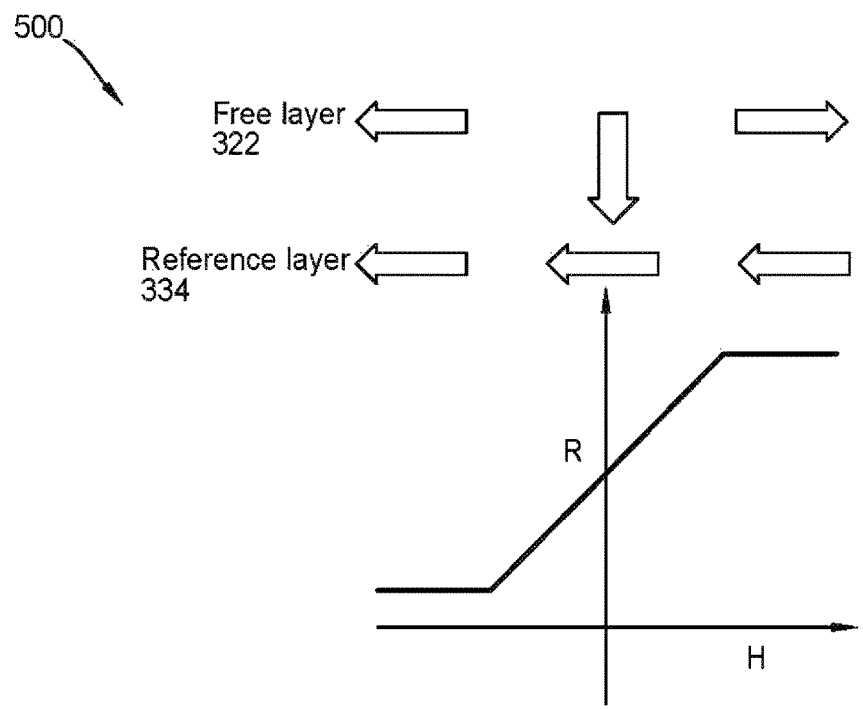
FIGS. 5A-5B illustrate graphs of an output signal versus an applied external field for the first and second TMR films.
Figure 5B:
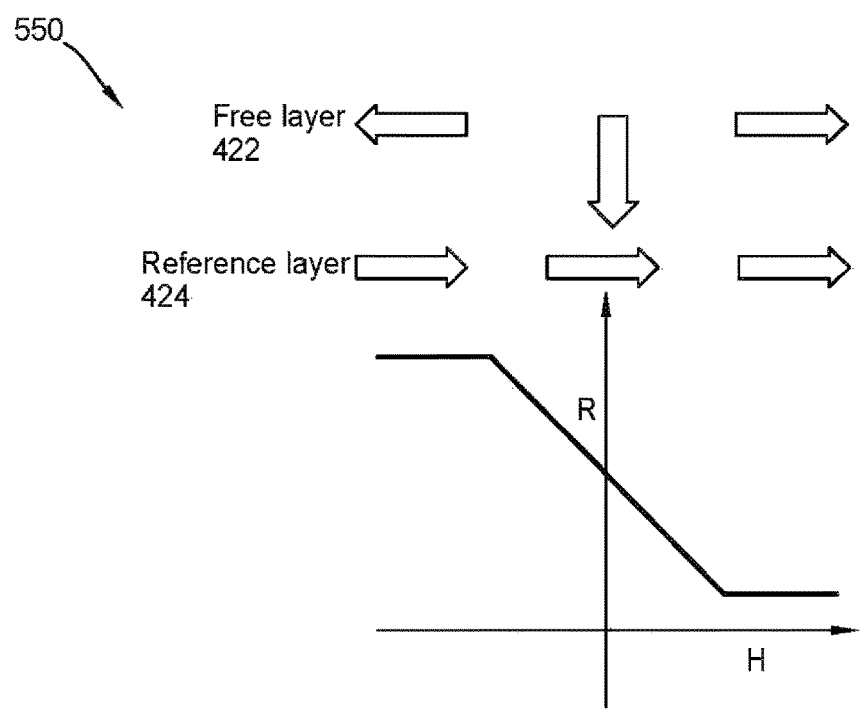

FIGS. 5A-5B illustrate graphs 500, 550, respectively, of an output signal versus an applied external field for the first and second TMR films. FIG. 5A illustrates a graph 500 of the output signal or resistivity (R) versus an applied external field (H) for the first TMR film 220 of FIGS. 2 and 3B. FIG. 5B illustrates a graph 550 of the output signal or resistivity (R) versus an applied external field (H) for the second TMR film 230 of FIGS. 2 and 4B.

As shown in FIG. 5A, the TMR resistance of the first TMR film increases linearly with the applied field. The magnetization direction 324 reference layer of the first TMR film is fixed and points in the −x-direction. The magnetization direction 422 of the free layer rotates as the external field increases, first pointing in the −x-direction, then pointing in the −y-direction, and then pointing in the x-direction.

As shown in FIG. 5B, the TMR resistance of the second TMR film decreases linearly with the applied field. The magnetization direction 424 reference layer of the second TMR film is fixed and points in the x-direction. The magnetization direction 422 of the free layer rotates as the external field increases, first pointing in the −x-direction, then pointing in the −y-direction, and then pointing in the x-direction.

FIGS. 5A and 5B demonstrate that due to the first TMR film 220 and the second TMR film 230 having different RL magnetization directions, the TMR resistance response of each film is equal but opposite (i.e., the first TMR film increases linearly while the second TMR film decreases linearly).

Therefore, utilizing the above-described TMR sensor device or Wheatstone bridge design having four resistors comprised of two different TMR films results in a magnetic sensor operating operates in the full magnetoresistance range while achieving the maximum output voltage. By using a first TMR film for the first and fourth resistors and a second TMR film for the second and third resistors, the magnetoresistance response of the resistors is equal but reversed, resulting in a full bridge sensing scheme attaining maximum sensitivity for a given TMR ratio.

In one embodiment, the TMR sensor is used in a camera operating as a single axis sensor. An example of such a sensor is found in United States Patent Application Publication No.: 2019/0020822 A1, which is incorporated herein by reference. However, it is contemplated that the TMR sensor may be utilized as a two dimensional or even a three dimensional sensor. Additionally, it is contemplated that TMR sensor may be integrated and utilized in inertial measurement unit technologies other than cameras such as wearable devices, compasses, and MEMS devices. Furthermore, the TMR sensor may operate as a position sensor, a bridge angular sensor, a magnetic switch, a current sensor, or combinations thereof. The TMR sensor may be used to focus a camera such as a smart phone camera by using the TMR sensors as position and angular sensors. Also, TMR sensors have applicability in the automotive industry as switch, current, and angular sensors to replace current Hall, anisotropic magnetoresistance (AMR) and giant magnetoresistance (GMR) sensors. TMR sensors may also be used in the drones and robotics industry as position and angular sensors. Medical devices can also utilize TMR sensors for flow rate control for infusion systems and endoscope camera sensors among others. Thus, the TMR sensors discussed herein have applications well beyond smart phone cameras and thus should not be limited to use as sensors for smart phone cameras. Furthermore, TMR sensors need not be arranged in a Wheatstone bridge arrangement, but rather, may be arranged in any number of manners.

In one embodiment, a TMR sensor device comprises at least one TMR sensor comprising a first TMR film, the first TMR film comprising a first reference layer having a first magnetization direction and a first pinned layer having a second magnetization direction, the first magnetization direction of the first reference layer being anti-parallel to the second magnetization direction of the first pinned layer, wherein the first pinned layer comprises a Co/CoFe/Co multi-layer stack having a thickness between about 20 Angstroms and about 30 Angstroms, and wherein the first reference layer comprises a CoFe/Ta/CoFeB/CoFe multi-layer stack having a thickness between about 21 Angstroms and about 37 Angstroms, and at least one TMR sensor comprising a second TMR film, the second TMR film comprising a second reference layer having a first third magnetization direction, a first second pinned layer having the first third magnetization direction, and a second third pinned layer having a second fourth magnetization direction, the first third magnetization direction of the second reference layer and the first second pinned layer being anti-parallel to the second fourth magnetization direction of the second third pinned layer, wherein the second pinned layer comprises a Co/CoFe/Co multi-layer stack having a thickness between about 20 Angstroms and about 30 Angstroms, wherein the third pinned layer comprises a Co/CoFe/Co multi-layer stack having a thickness between about 35 Angstroms and about 55 Angstroms, and wherein the second reference layer comprises a CoFe/Ta/CoFeB/CoFe multi-layer stack having a thickness between about 21 Angstroms and about 37 Angstroms.

The at least one TMR sensor comprised of the first TMR film comprises a first TMR sensor and a fourth TMR sensor, and the at least one TMR sensor comprised of the second TMR film comprises a second TMR sensor and a third TMR sensor. The first TMR sensor is adjacent to the second TMR sensor and the third TMR sensor, the second TMR sensor is adjacent to the first TMR sensor and the fourth TMR sensor, the third TMR sensor is adjacent to the first TMR sensor and the fourth TMR sensor, and the fourth TMR sensor is adjacent to the second TMR sensor and the third TMR sensor. The first TMR film further comprises a first free layer, a first barrier layer, a first spacer layer, a first antiferromagnetic layer, and a first seed layer. The first barrier layer is disposed between the first reference layer and the first free layer, the first spacer layer is disposed between the first reference layer and the first pinned layer, and the first antiferromagnetic layer is disposed between the first pinned layer and the first seed layer.

The second TMR film further comprises a second free layer, a second barrier layer, a second spacer layer, a third spacer layer, a second antiferromagnetic layer, and a second seed layer, and the second barrier layer is disposed between the second reference layer and the second free layer, the second spacer layer is disposed between the second reference layer and the third pinned layer, the third spacer layer is disposed between the second pinned layer and the third pinned layer, and the second antiferromagnetic layer is disposed between the second pinned layer and the second seed layer. The first TMR film has a total thickness of about 120 Angstroms to about 630 Angstroms, and wherein the second TMR film has a total thickness of about 155 Angstroms to about 1,675 Angstroms. A Co composition in CoFe of the Co/CoFe/Co multilayer stack of the first pinned layer is between about 25% and 70%, wherein a B composition in CoFeB of the CoFe/Ta/CoFeB/CoFe multilayer stack of the first reference layer is between about 15% and 25%, wherein a Co composition in CoFe of the Co/CoFe/Co multilayer stack of the second pinned layer is between about 25% and 70%, and wherein a Co composition in CoFe of the Co/CoFe/Co multilayer stack of the third pinned layer is between about 25% and 70%.

In another embodiment, a TMR sensor device comprises first resistor comprising a first TMR film, the first TMR film comprising a first reference layer having a first magnetization direction, wherein the first reference layer comprises a CoFe/Ta/CoFeB/CoFe multilayer stack having a thickness between about 21 Angstroms and about 37 Angstroms, a second resistor comprising a second TMR film, the second TMR film comprising a second reference layer having a second magnetization direction, wherein the second reference layer comprises a CoFe/Ta/CoFeB/CoFe multilayer stack having a thickness between about 21 Angstroms and about 37 Angstroms, and wherein the first magnetization direction of the first reference layer of the first TMR film is anti-parallel to the second magnetization of the second reference layer of the second TMR film, a third resistor comprising the second TMR film, and a fourth resistor comprising the first TMR film.

The first TMR film further comprises a first free layer, a first barrier layer, a first spacer layer, a first pinned layer, a first antiferromagnetic layer, and a first seed layer. The first barrier layer is disposed between the first reference layer and the first free layer, the first spacer layer is disposed between the first reference layer and the first pinned layer, and the first antiferromagnetic layer is disposed between the first pinned layer and the first seed layer. The second TMR film further comprises a second free layer, a second barrier layer, a second spacer layer, a second pinned layer, a third spacer layer, a third pinned layer, a second antiferromagnetic layer, and a second seed layer. The second barrier layer is disposed between the second reference layer and the second free layer, the second spacer layer is disposed between the second reference layer and the third pinned layer, the third spacer layer is disposed between the second pinned layer and the third pinned layer, and the second antiferromagnetic layer is disposed between the second pinned layer and the second seed layer.

The third pinned layer of the second TMR film has a third magnetization direction parallel to the first magnetization direction of the first reference layer of the first TMR film. The first free layer of the first TMR film has a fourth magnetization direction parallel to a fifth magnetization direction of the second free layer of the second TMR film. The fourth magnetization of the first free layer of the first TMR film is parallel to a sixth magnetization direction of the first pinned layer of the first TMR film. The first pinned layer of the first TMR film comprises a Co/CoFe/Co multi-layer stack having a thickness between about 20 Angstroms and about 30 Angstroms, wherein the second pinned layer of the second TMR film comprises a Co/CoFe/Co multi-layer stack having a thickness between about 20 Angstroms and about 30 Angstroms, and wherein the third pinned layer of the second TMR film comprises a Co/CoFe/Co multi-layer stack having a thickness between about 35 Angstroms and about 55 Angstroms. wherein the second pinned layer of the second TMR film has a greater thickness than the first pinned layer of the second TMR film. The first TMR film has a total thickness of about 120 Angstroms to about 630 Angstroms, and wherein the second TMR film has a total thickness of about 155 Angstroms to about 1,675 Angstroms.

In another embodiment, a method of fabricating a TMR sensor device having a first resistor, a second resistor, a third resistor, and a fourth resistor, comprising forming a first TMR film by depositing a first seed layer, depositing a first antiferromagnetic layer on the first seed layer, depositing a first pinned layer on the first antiferromagnetic layer, the first pinned layer comprising a Co/CoFe/Co multi-layer stack having a thickness between about 20 Angstroms and about 30 Angstroms, depositing a first spacer layer on the first pinned layer, depositing a first reference layer on the first spacer layer, the first reference layer comprising a CoFe/Ta/CoFeB/CoFe multilayer stack having a thickness between about 21 Angstroms and about 37 Angstroms, depositing a first barrier layer on the first reference layer, and depositing a first free layer on the first barrier layer, magnetically annealing the first TMR film to change a first magnetization direction of the first reference layer to be anti-parallel to a second magnetization direction of the first pinned layer, forming a second TMR film by depositing a second seed layer, depositing a second antiferromagnetic layer on the second seed layer, depositing a second pinned layer on the second antiferromagnetic layer, the second pinned layer comprising a Co/CoFe/Co multi-layer stack having a thickness between about 20 Angstroms and about 30 Angstroms, depositing a second spacer layer on the second pinned layer, depositing a third pinned layer on the second spacer layer, the third pinned layer comprising a Co/CoFe/Co multi-layer stack having a thickness between about 35 Angstroms and about 55 Angstroms, depositing a third spacer layer on the third pinned layer, depositing a second reference layer on the third spacer layer, the second reference layer comprising a CoFe/Ta/CoFeB/CoFe multilayer stack having a thickness between about 21 Angstroms and about 37 Angstroms, depositing a second barrier layer on the second reference layer, and depositing a second free layer on the second barrier layer, magnetically annealing the second TMR film to change a third magnetization direction of the third pinned layer to be anti-parallel to a fourth magnetization direction of the second reference layer, wherein the first magnetization direction of the first reference layer of the first TMR film is anti-parallel to the fourth magnetization direction of the second reference layer of the second TMR film, forming the first resistor and the fourth resistor from the first TMR film, and forming the second resistor and the third resistor from the second TMR film, wherein the first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor.

The first TMR film and the second TMR film are magnetically annealed in a magnetic oven at a temperature between about 250 degrees Celsius and about 300 degrees Celsius under a magnetic field of between about 1 Tesla to about 5 Tesla. Forming the first resistor and the fourth resistor from the first TMR film comprises depositing the first TMR film over a first bottom lead and a second bottom lead, and forming a first top lead over the first bottom lead and a second top lead over the second bottom lead. Forming the second resistor and the third resistor from the second TMR film comprises depositing the second TMR film over a third bottom lead and a fourth bottom lead, and forming a third top lead over the third bottom lead and a fourth top lead over the fourth bottom lead. The first TMR film has a total thickness of about 120 Angstroms to about 630 Angstroms, and wherein the second TMR film has a total thickness of about 155 Angstroms to about 1,675 Angstroms. The first, second, third, and fourth resistors are TMR sensors.

While the foregoing is directed to embodiments of the present disclosure, other and further embodiments of the disclosure may be devised without departing from the basic scope thereof, and the scope thereof is determined by the claims that follow.

What is claimed is:

1. A tunneling magnetoresistance (TMR) sensor device, comprising:
   at least one TMR sensor comprising a first TMR film, the first TMR film comprising a first reference layer having a first magnetization direction, a first pinned layer having a second magnetization direction, a first free layer, a first barrier layer, a first spacer layer, a first antiferromagnetic layer, and a first seed layer, the first magnetization direction of the first reference layer being anti-parallel to the second magnetization direction of the first pinned layer,
      wherein the first pinned layer comprises a multi-layer stack comprising Cobalt (Co), Cobalt-iron (CoFe), and Co having a thickness between 20 Angstroms and 30 Angstroms, and
      wherein the first reference layer comprises a multilayer stack comprising CoFe, Tantalum (Ta), Cobalt-iron-boron (CoFeB), and CoFe having a thickness between 21 Angstroms and 37 Angstroms; and
   at least one TMR sensor comprising a second TMR film, the second TMR film comprising a second reference layer having a third magnetization direction, a second pinned layer having the third magnetization direction, a third pinned layer having a fourth magnetization direction, a second free layer, a second barrier layer, a second spacer layer, a third spacer layer, a second antiferromagnetic layer, and a second seed layer, the third magnetization direction of the second reference layer and the second pinned layer being anti-parallel to the fourth magnetization direction of the third pinned layer,
      wherein the second pinned layer comprises a multi-layer stack comprising Co, CoFe, and Co having a thickness between 20 Angstroms and 30 Angstroms,
      wherein the third pinned layer comprises a multi-layer stack comprising Co, CoFe, and Co having a thickness between 35 Angstroms and 55 Angstroms,
      wherein the second reference layer comprises a multi-layer stack comprising CoFe, Ta, CoFeB, and CoFe having a thickness between 21 Angstroms and 37 Angstroms.

2. The TMR sensor device of claim 1, wherein the at least one TMR sensor comprised of the first TMR film comprises a first TMR sensor and a fourth TMR sensor, and wherein the at least one TMR sensor comprised of the second TMR film comprises a second TMR sensor and a third TMR sensor.

3. The TMR sensor device of claim 2, wherein the first TMR sensor is adjacent to the second TMR sensor and the third TMR sensor, the second TMR sensor is adjacent to the first TMR sensor and the fourth TMR sensor, the third TMR sensor is adjacent to the first TMR sensor and the fourth TMR sensor, and the fourth TMR sensor is adjacent to the second TMR sensor and the third TMR sensor.

4. The TMR sensor device of claim 1, wherein the first barrier layer is disposed between the first reference layer and the first free layer, the first spacer layer is disposed between the first reference layer and the first pinned layer, and the first antiferromagnetic layer is disposed between the first pinned layer and the first seed layer.

5. The TMR sensor device of claim 1, wherein the second barrier layer is disposed between the second reference layer and the second free layer, the second spacer layer is disposed between the second reference layer and the third pinned layer, the third spacer layer is disposed between the third pinned layer and the second pinned layer, and the second antiferromagnetic layer is disposed between the second pinned layer and the second seed layer.

6. The TMR sensor device of claim 5, wherein the first TMR film has a total thickness of about 120 Angstroms to about 630 Angstroms, and wherein the second TMR film has a total thickness of about 155 Angstroms to about 1,675 Angstroms.

7. The TMR sensor device of claim 1, wherein a Co composition in CoFe of the multilayer stack comprising Co, CoFe, and Co of the first pinned layer is between about 25% and 70%, wherein a B composition in CoFeB of the multi-layer stack comprising CoFe, Ta, CoFeB, and CoFe of the first reference layer is between about 15% and 25%, wherein a Co composition in CoFe of the comprising Co, CoFe, and Co multilayer stack of the second pinned layer is between about 25% and 70%, and wherein a Co composition in CoFe of the multilayer stack comprising Co, CoFe, and Co of the third pinned layer is between about 25% and 70%.

8. A TMR sensor device, comprising:
   a first resistor comprising a first TMR film, the first TMR film comprising a first reference layer having a first magnetization direction, a first free layer, a first barrier layer, a first spacer layer, a first pinned layer, a first antiferromagnetic layer, and a first seed layer, wherein the first reference layer comprises a multilayer stack comprising Cobalt-iron (CoFe), Tantalum (Ta), Cobalt-iron-boron (CoFeB), and CoFe having a thickness between 21 Angstroms and 37 Angstroms;
   a second resistor comprising a second TMR film, the second TMR film comprising a second reference layer having a second magnetization direction, a second free layer, a second barrier layer, a second spacer layer, a second pinned layer, a third spacer layer, a third pinned layer, a second antiferromagnetic layer, and a second seed layer, wherein the second reference layer comprises a multilayer stack comprising CoFe, Ta, CoFeB, and CoFe having a thickness between 21 Angstroms and 37 Angstroms, and wherein the first magnetization direction of the first reference layer of the first TMR film is anti-parallel to the second magnetization of the second reference layer of the second TMR film;
   a third resistor comprising the second TMR film; and
   a fourth resistor comprising the first TMR film.

9. The TMR sensor device of claim 8, wherein the first barrier layer is disposed between the first reference layer and the first free layer, the first spacer layer is disposed between the first reference layer and the first pinned layer, and the first antiferromagnetic layer is disposed between the first pinned layer and the first seed layer, and
   wherein the second barrier layer is disposed between the second reference layer and the second free layer, the second spacer layer is disposed between the second reference layer and the third pinned layer, the third spacer layer is disposed between the third pinned layer and the second pinned layer, and the second antiferromagnetic layer is disposed between the second pinned layer and the second seed layer.

10. The TMR sensor device of claim 9, wherein the third pinned layer of the second TMR film has a third magnetization direction parallel to the first magnetization direction of the first reference layer of the first TMR film.

11. The TMR sensor device of claim 9, wherein the first free layer of the first TMR film has a fourth magnetization direction parallel to a fifth magnetization direction of the second free layer of the second TMR film.

12. The TMR sensor device of claim 11, wherein the fourth magnetization of the first free layer of the first TMR film is parallel to a sixth magnetization direction of the first pinned layer of the first TMR film.

13. The TMR sensor device of claim 9, wherein the first pinned layer of the first TMR film comprises a multi-layer stack comprising Co, CoFe, and Co having a thickness between 20 Angstroms and 30 Angstroms, wherein the second pinned layer of the second TMR film comprises a multi-layer stack comprising Co, CoFe, and Co having a thickness between 20 Angstroms and 30 Angstroms, and wherein the third pinned layer of the second TMR film comprises a multi-layer stack comprising Co, CoFe, and Co having a thickness between 35 Angstroms and 55 Angstroms.

14. The TMR sensor device of claim 13, wherein the first TMR film has a total thickness of about 120 Angstroms to about 630 Angstroms, and wherein the second TMR film has a total thickness of about 155 Angstroms to about 1,675 Angstroms.

15. A method of fabricating a TMR sensor device having a first resistor, a second resistor, a third resistor, and a fourth resistor, comprising:
forming a first TMR film by:
depositing a first seed layer,
depositing a first antiferromagnetic layer on the first seed layer,
depositing a first pinned layer on the first antiferromagnetic layer, the first pinned layer comprising a multi-layer stack comprising Cobalt (Co), Cobalt-iron (CoFe), and Co having a thickness between 20 Angstroms and 30 Angstroms,
depositing a first spacer layer on the first pinned layer,
depositing a first reference layer on the first spacer layer, the first reference layer comprising a multi-layer stack comprising CoFe, Tantalum (Ta), Cobalt-iron-boron (CoFeB), and CoFe having a thickness between 21 Angstroms and 37 Angstroms,
depositing a first barrier layer on the first reference layer, and
depositing a first free layer on the first barrier layer;
magnetically annealing the first TMR film to change a first magnetization direction of the first reference layer to be anti-parallel to a second magnetization direction of the first pinned layer;
forming a second TMR film by:
depositing a second seed layer,
depositing a second antiferromagnetic layer on the second seed layer,
depositing a second pinned layer on the second antiferromagnetic layer, the second pinned layer comprising a multi-layer stack comprising Co, CoFe, and Co having a thickness between 20 Angstroms and 30 Angstroms,
depositing a second spacer layer on the second pinned layer,
depositing a third pinned layer on the second spacer layer, the third pinned layer comprising a multi-layer stack comprising Co, CoFe, and Co having a thickness between 35 Angstroms and 55 Angstroms,
depositing a third spacer layer on the third pinned layer,
depositing a second reference layer on the third spacer layer, the second reference layer comprising a multilayer stack comprising CoFe, Ta, CoFeB, and CoFe having a thickness between 21 Angstroms and 37 Angstroms,
depositing a second barrier layer on the second reference layer, and
depositing a second free layer on the second barrier layer;
magnetically annealing the second TMR film to change a third magnetization direction of the third pinned layer to be anti-parallel to a fourth magnetization direction of the second reference layer, wherein the first magnetization direction of the first reference layer of the first TMR film is anti-parallel to the fourth magnetization direction of the second reference layer of the second TMR film;
forming the first resistor and the fourth resistor from the first TMR film; and
forming the second resistor and the third resistor from the second TMR film, wherein the first resistor is adjacent to the second resistor and the third resistor, the second resistor is adjacent to the first resistor and the fourth resistor, the third resistor is adjacent to the first resistor and the fourth resistor, and the fourth resistor is adjacent to the second resistor and the third resistor.

16. The method of claim 15, wherein the first TMR film and the second TMR film are magnetically annealed in a magnetic oven at a temperature between about 250 degrees Celsius and about 300 degrees Celsius under a magnetic field of between about 1 Tesla to about 5 Tesla.

17. The method of claim 15, wherein forming the first resistor and the fourth resistor from the first TMR film comprises depositing the first TMR film over a first bottom lead and a second bottom lead, and forming a first top lead over the first bottom lead and a second top lead over the second bottom lead.

18. The method of claim 15, wherein forming the second resistor and the third resistor from the second TMR film comprises depositing the second TMR film over a third bottom lead and a fourth bottom lead, and forming a third top lead over the third bottom lead and a fourth top lead over the fourth bottom lead.

19. The method of claim 15, wherein the first TMR film has a total thickness of about 120 Angstroms to about 630 Angstroms, and wherein the second TMR film has a total thickness of about 155 Angstroms to about 1,675 Angstroms.

20. The method of claim 15, wherein the first, second, third, and fourth resistors are TMR sensors.

* * * * *